United States Patent

Blair

[19]

[11] Patent Number: 5,882,976
[45] Date of Patent: Mar. 16, 1999

[54] METHOD OF FABRICATING A SELF-ALIGNED DOUBLE POLYSILICON NPN TRANSISTOR WITH POLY ETCH STOP

[75] Inventor: Christopher S. Blair, San Jose, Calif.

[73] Assignee: National Semiconductor Corporation, Santa Clara, Calif.

[21] Appl. No.: 942,102

[22] Filed: Oct. 1, 1997

[51] Int. Cl.$^6$ ................................................. H01L 21/331
[52] U.S. Cl. ........................ 438/309; 438/365; 438/368
[58] Field of Search ..................................... 438/309, 365, 438/366, 368, 364

[56] References Cited

U.S. PATENT DOCUMENTS

| | | | |
|---|---|---|---|
| 4,892,837 | 1/1990 | Kudo | 438/365 |
| 5,494,836 | 2/1996 | Imai | 438/365 |
| 5,504,018 | 4/1996 | Sato | 438/350 |

Primary Examiner—Tuan H. Nguyen
Attorney, Agent, or Firm—Limbach & Limbach L.L.P.

[57] ABSTRACT

A method of forming a double polysilicon NPN transistor using a self-aligned process flow. The method includes use of a sacrificial oxide layer deposited over an epitaxial silicon layer prior to deposition and doping of the polysilicon layer from which the base electrode is formed. The sacrificial oxide layer acts as an etch stop for the plasma etch used to pattern the polysilicon layer. After patterning of the doped polysilicon layer, the sacrificial layer is removed using a wet etch. Etching of the oxide layer is performed in a manner which undercuts the doped polysilicon layer. Polysilicon is then deposited by a CVD process in the undercut region from which the initial polysilicon layer has been removed. The CVD deposited polysilicon fills in the gap between the doped polysilicon layer and the underlying epitaxial silicon layer caused by the oxide etch. The CVD deposited polysilicon is then oxidized. The portion of the CVD deposited polysilicon between the doped polysilicon layer and the single crystal silicon remains unoxidized. The oxidized CVD deposited polysilicon is then etched to form sidewall spacers. A second polysilicon layer is then deposited over the substrate and then implanted with an appropriate N+ type dopant. The transistor structure is then annealed to form junctions for the device.

13 Claims, 7 Drawing Sheets

METHOD OF FABRICATING A SELF-ALIGNED DOUBLE POLYSILICON NPN TRANSISTOR WITH POLY ETCH STOP

TECHNICAL FIELD

The present invention is directed to double polysilicon NPN transistors and methods of making such devices, and more specifically, to a process for making a double poly NPN device which includes the use of a sacrificial oxide layer between a polysilicon base electrode and active silicon. This allows the polysilicon layer to be over-etched to prevent shorting due to poly "stringers" without an associated undesirable etching of the single crystal silicon beneath the poly layer.

BACKGROUND OF THE INVENTION

Currently used process flows for forming double polysilicon NPN transistors typically deposit the first polysilicon layer directly on an active silicon region in order to obtain electrical contact between the two layers. The polysilicon layer is then patterned to form the base contacts (electrodes) for the device. The patterning step can cause problems because the polysilicon layer must be etched (typically in a plasma etch) without etching too much of the underlying silicon layer. Since plasma etches are almost equally selective to both polysilicon and the active silicon (i.e., polysilicon and single crystal silicon are etched at nearly the same rate), any amount of over-etching of the polysilicon will remove the single crystal silicon beneath the polysilicon layer. This recesses the active silicon region of the device and alters the characteristics of the final transistor. For example, critical transistor parameters such as β (the transistor gain), $BV_{ebo}$ (the emitter-base breakdown voltage), $BV_{ceo}$ (the collector-emitter breakdown voltage), and the base resistance can be affected by the polysilicon over-etch. Thus, in the case of a self-aligned double poly NPN process, over-etching of the polysilicon layer has undesirable consequences for the NPN device.

However, it is desirable in most double poly NPN process flows to significantly over-etch the polysilicon layer to prevent inadvertent shorting of the device due to formation of polysilicon "stringers". But, as noted, performing such an over-etch in a self-aligned polysilicon process will lead to etching of the underlying single crystal silicon. Thus, in such processes, a polysilicon over-etch is generally not performed, and, as a result, the process has a low yield.

Another disadvantage of conventional double polysilicon process flows is a lack of control of the characteristics of the emitter-extrinsic base junction. The location and dimensions of a recess used to form the junction, which is produced during the polysilicon (over)etch, is difficult to control and is a variable and often significant source of base resistance. This is because the base resistance is a strong function of the recess dimensions. Thus, the use of a polysilicon over-etch in a self-aligned double poly process flow has significant disadvantages that can overcome the advantage of reducing polysilicon stringers. These competing factors are subjected to a trade-off in most processes, with the result that suboptimal transistors are produced with a medium to poor yield.

FIGS. 1(A) through 1(F) are side views showing the process flow for a conventional self-aligned double poly NPN transistor. As shown in FIG. 1(A), the process begins with a single crystal silicon substrate 102 in which is formed an N+ type buried layer 104 by implantation and diffusion of appropriate dopants. Next, an N– type epitaxial silicon layer 106 is grown over the surface of substrate 102. Isolation regions 108 (labelled "field oxide" in the figure) are then formed to define the epitaxial silicon active device region. A first polysilicon layer which will be used to form the base contact (electrode) for the device is then deposited over the surface of substrate 102. The polysilicon layer is doped to a P+ type by standard masking and implant steps. The device structure is then annealed to drive in the P+ type dopant, a producing P+ doped polysilicon layer 110. A layer of interpoly oxide 112 (or nitride) is then deposited over the surface of P+ type polysilicon layer 110.

Next, standard masking steps known in the semiconductor industry are used to pattern polysilicon layer 110 to define a location for the base contact. During the patterning step(s), an interpoly oxide layer 112 (or a nitride layer if one is used) is etched to remove appropriate portions of interpoly oxide layer 112 from the base contact location. This is followed by an etch of doped polysilicon layer 110 to remove appropriate portions of that layer. A link base implantation may then be performed (if desired) to reduce the base resistance of the final device. Note that if a polysilicon over-etch is performed to eliminate poly stringers, a recess 120 is formed in epitaxial silicon layer 106. The resulting structure is shown in FIG. 1(B).

Next, an oxide layer 122 is deposited over the surface of substrate 102. Oxide layer 122 will be used to form sidewall spacers for electrically isolating the transistor emitter from the source and drain regions. As shown in FIG. 1(C), oxide layer 122 fills in recess 120 formed in epitaxial silicon layer 106.

Sidewall spacers 123 are then formed using an etchback step which is more selective to oxide layer 122 than to interpoly oxide layer 112. The resulting structure is shown in FIG. 1(D).

An appropriate dopant is then implanted into the base region to form the intrinsic base (shown as P– base 124 in the figure). A second layer of polysilicon 126 is then deposited over the surface of substrate 102. Polysilicon layer 126 is then implanted with an appropriate N+ type dopant (e.g., Arsenic or Phosphorus) as part of the process of forming the emitter for the device. The resulting structure is shown in FIG. 1(E).

Next, a final anneal step is performed to drive in the implanted dopants and form the junctions for the device. As shown in FIG. 1(F), the anneal step causes the P+ type dopant in polysilicon layer 110 to be driven into epitaxial silicon layer 106 in the areas surrounding the P– type intrinsic base region 124. The anneal step also causes the N+ type dopant implanted into polysilicon layer 126 to be driven into epitaxial layer 106. As discussed, although the appropriate structure for the device can be constructed using these steps, the over-etch of polysilicon layer 110 causes etching into the epitaxial silicon layer 106. This reduces the depth of the active region and also leads to a poorly defined emitter-base junction (i.e., where the N+ and P– type dopant concentrations are approximately equal). Both of these results have a negative impact on the operational characteristics of the device.

What is desired is a method of forming a double polysilicon NPN transistor using a self-aligned process which does not result in an etching of the silicon layer 106 underlying the base contact polysilicon layer 110. Such a method would allow the desirable over-etching of the polysilicon layer 110 without the presently associated disadvantages of such a step.

SUMMARY OF THE INVENTION

The present invention is directed to a method of forming a double polysilicon NPN transistor using a self-aligned process flow. The method includes use of a sacrificial oxide layer deposited over an epitaxial silicon layer prior to deposition and doping of the polysilicon layer from which the base electrode is formed. The sacrificial oxide layer acts as an etch stop for the plasma etch used to pattern the polysilicon layer. After patterning of the doped polysilicon layer, the sacrificial layer is removed using a wet etch. Etching of the oxide layer is performed in a manner which leads to undercutting of the doped polysilicon layer.

Next, polysilicon is deposited by a CVD process in the region from which the initial doped polysilicon layer has been removed. The CVD deposited polysilicon fills in the gap between the doped polysilicon layer and the underlying epitaxial silicon layer caused by the undercutting of the doped polysilicon. The CVD deposited polysilicon is then oxidized. The CVD deposited polysilicon between the doped polysilicon layer and the single crystal (epitaxial) silicon layer remains unoxidized, thus producing an electrical contact between those layers.

The oxidized CVD deposited polysilicon is then etched to form sidewall spacers. A second polysilicon layer is then deposited over the substrate. The second polysilicon layer is then implanted with an appropriate N+ type dopant. The transistor structure is then annealed to form junctions for the NPN device. During the anneal, the P+ type dopant implanted into the first polysilicon layer diffuses into the single crystal silicon to form the extrinsic base for the device.

Use of the inventive method permits over-etching of the base contact polysilicon layer to reduce the formation of polysilicon "stringers" without etching of the underlying single crystal silicon layer. This reduces the likelihood of polysilicon shorts and improves the yield of the process without impacting the operational characteristics of the device. In addition, use of oxidized polysilicon as a sidewall spacer provides superior step coverage compared to conventional deposited oxide layers. The inventive method can be used as part of both bipolar and BiCMOS process flows.

Further objects and advantages of the present invention will become apparent from the following detailed description and accompanying drawings.

DETAILED DESCRIPTION OF THE PREFERRED EMBODIMENT

FIGS. 2(A) through 2(H) are side views showing the process flow for a self-aligned double poly NPN transistor according to the present invention. Although the present invention will be described with reference to the formation of an NPN transistor, it is to be understood that it may be incorporated into both bipolar and BiCMOS process flows.

Figure 1A:
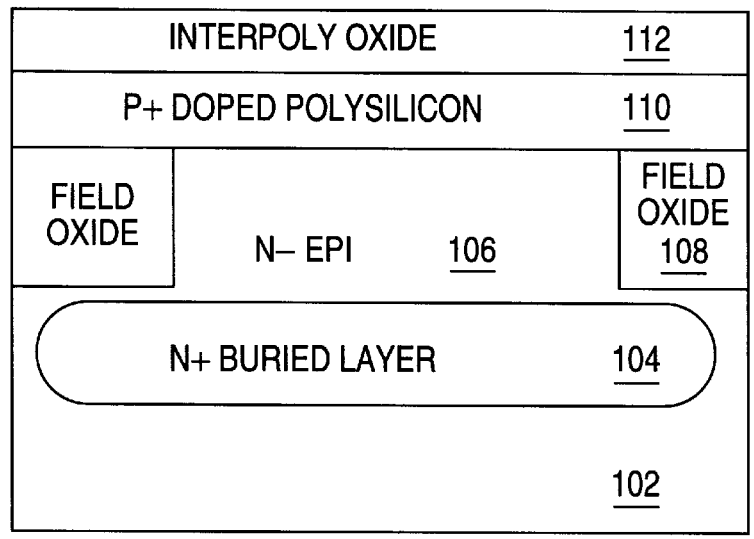
FIGS. 1(A) through 1(F) are side views showing the process flow for a conventional self-aligned double poly NPN transistor.
Figure 1B:
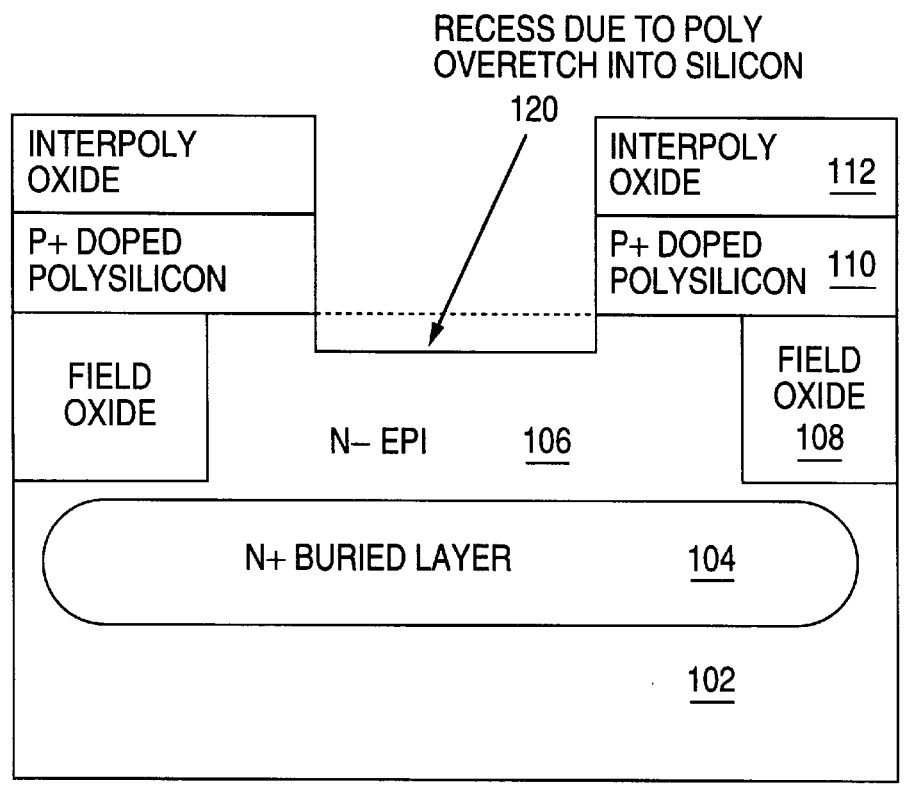
Figure 1C:
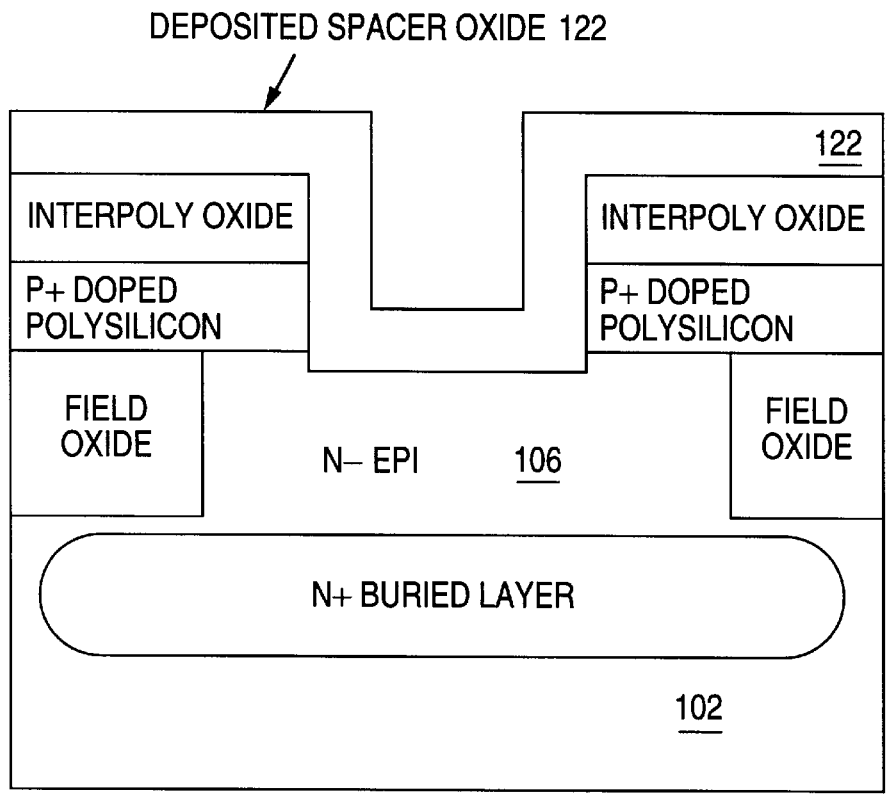
Figure 1D:
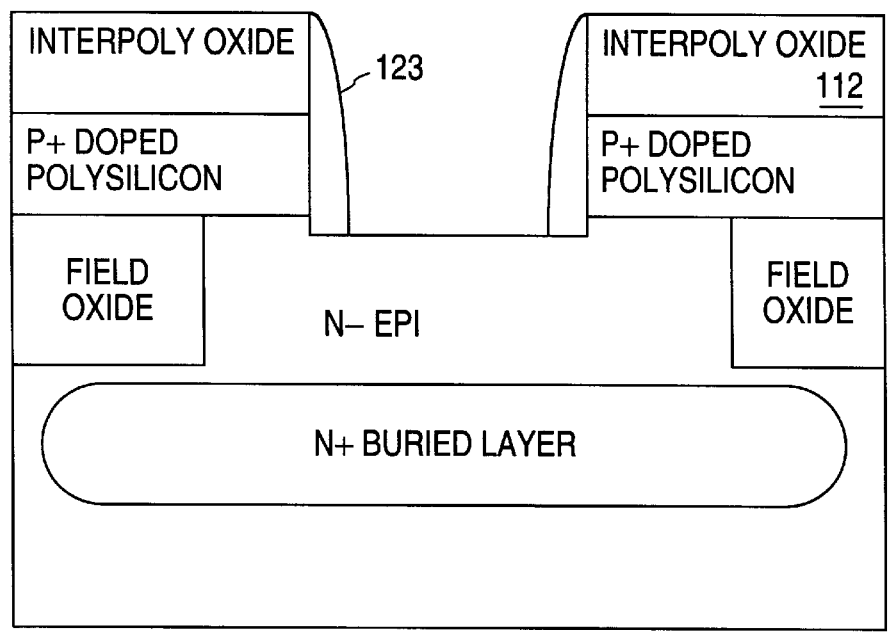
Figure 1E:
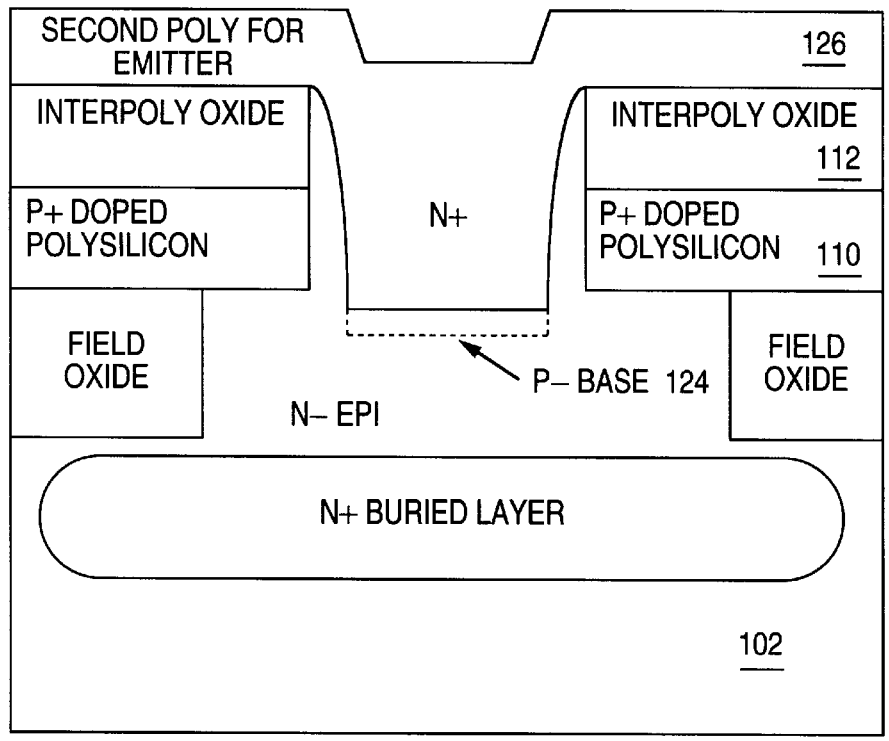
Figure 1F:
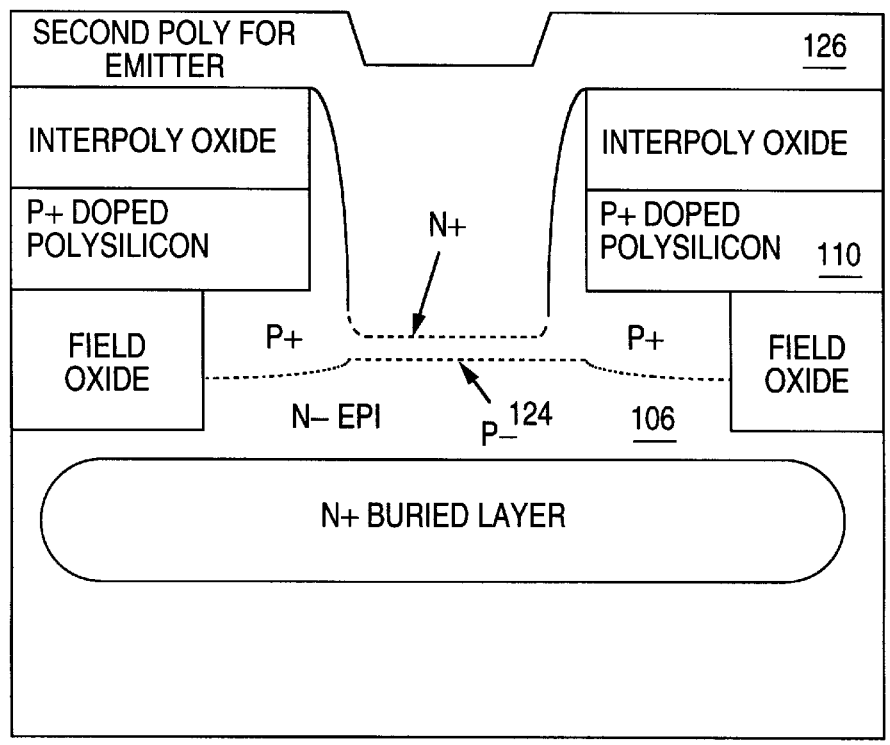
Figure 2A:
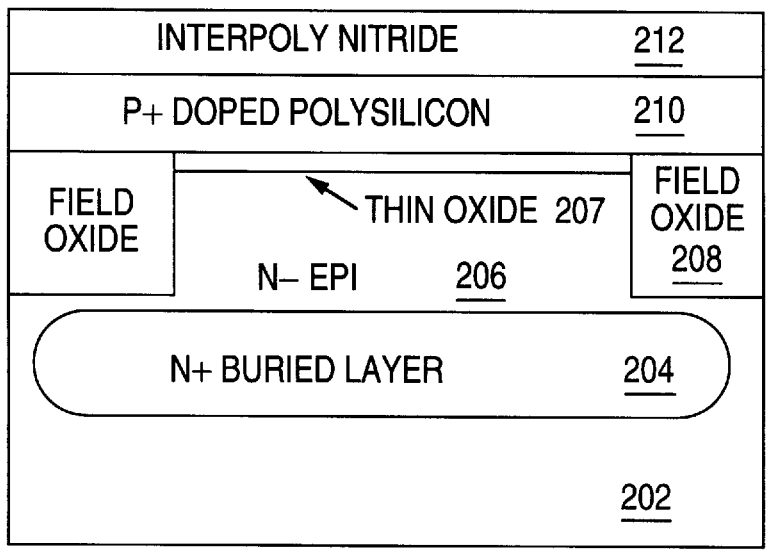
FIGS. 2(A) through 2(H) are side views showing the process flow for a self-aligned double poly NPN transistor according to the present invention.

As shown in FIG. 2(A), the process begins with a single crystal silicon substrate 202 in which is formed an N+ type buried layer 204 by implantation and diffusion of appropriate dopants. Next, an N– type epitaxial silicon layer 206 is grown over the surface of substrate 202. Isolation regions 208 (labelled "field oxide" in the figure) are then formed to define the epitaxial silicon active device region. A thin (50–300Å) layer of oxide 207 is then thermally grown over the surface of epitaxial silicon layer 206. A first polysilicon layer which will be used to form the base contact (electrode) for the device is then deposited over the surface of substrate 202. The polysilicon layer is then doped to a P+ type by standard masking and implant steps. The device structure is then annealed to drive in the P+ type dopant, producing P+ doped polysilicon layer 210. A layer of interpoly nitride 212 (or oxide) is then deposited over the surface of P+ type polysilicon layer 210. Note that nitride is the preferred interpoly material because of the wet etch step used later in the process.

Figure 2B:
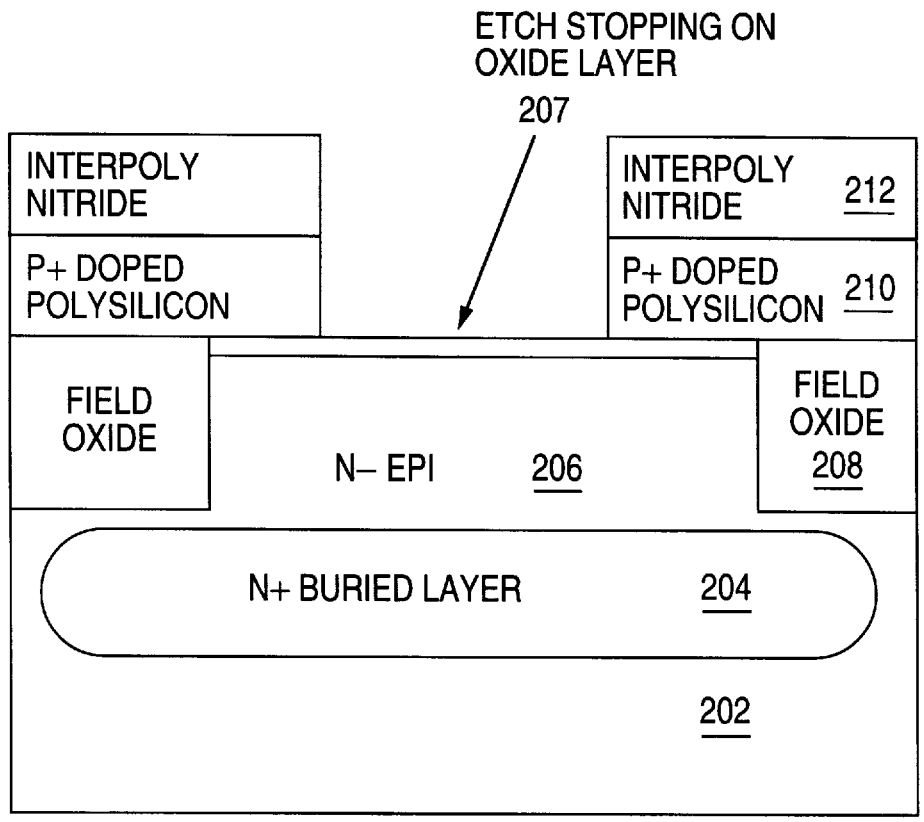

Next, standard masking steps known in the semiconductor industry are used to pattern polysilicon layer 210 to define a location for the base contact. During the patterning step(s), interpoly nitride layer 212 (or an oxide layer if one is used) is etched to remove the appropriate portions of interpoly nitride layer 212 from the base contact location. This is followed by a plasma etch of doped polysilicon layer 210 to remove the appropriate portions of that layer. A link base implantation may then be performed (if desired). Note that during the polysilicon etch to form the base electrodes, oxide layer 207 acts as an etch stop, thereby preventing etching of underlying epitaxial silicon layer 206. The resulting structure is shown in FIG. 2(B).

Figure 2C:
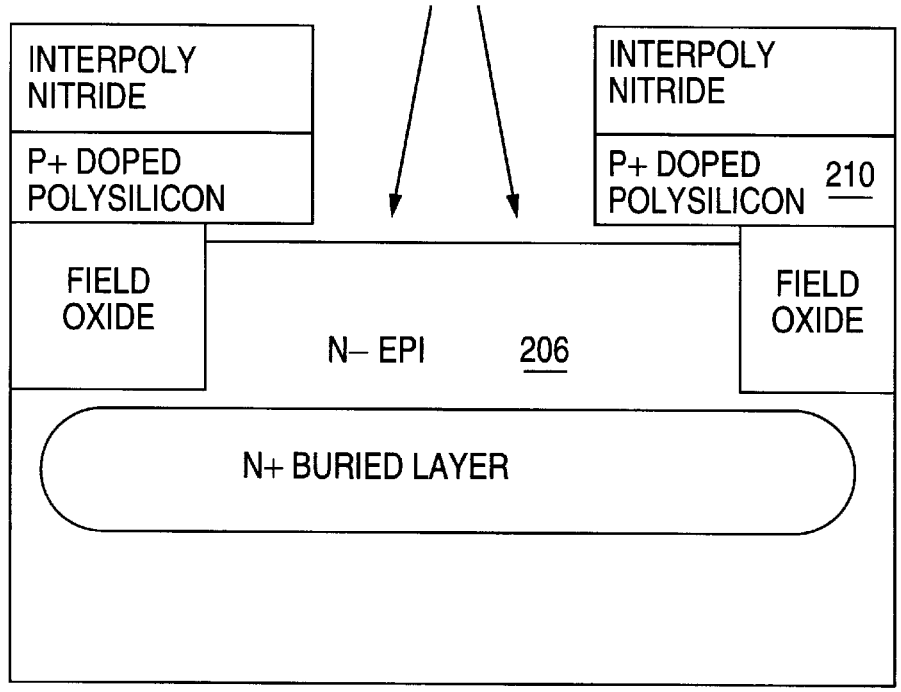

Next, a wet etch process is used to remove oxide layer 207 and undercut polysilicon layer 210. The wet etch process is performed for an extended time to undercut the polysilicon layer 210. The wet etch removes the oxide layer 207 but not the underlying single crystal silicon 206. Thus, in the process flow of the present invention, poly stringers can be removed (during the previous polysilicon etch) without damaging the device characteristics. The wet etch results in the formation of a gap between epitaxial silicon layer 206 and polysilicon layer 210 (labelled "wet etch undercut" 213 in the figure. The resulting structure is shown in FIG. 2(C).

Figure 2D:
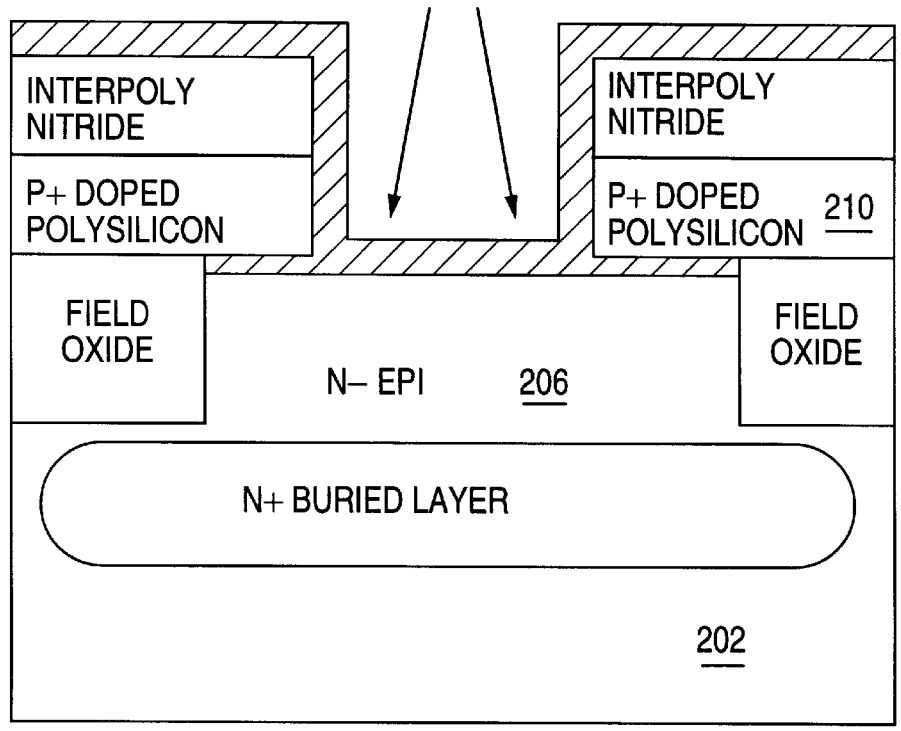
Figure 2E:
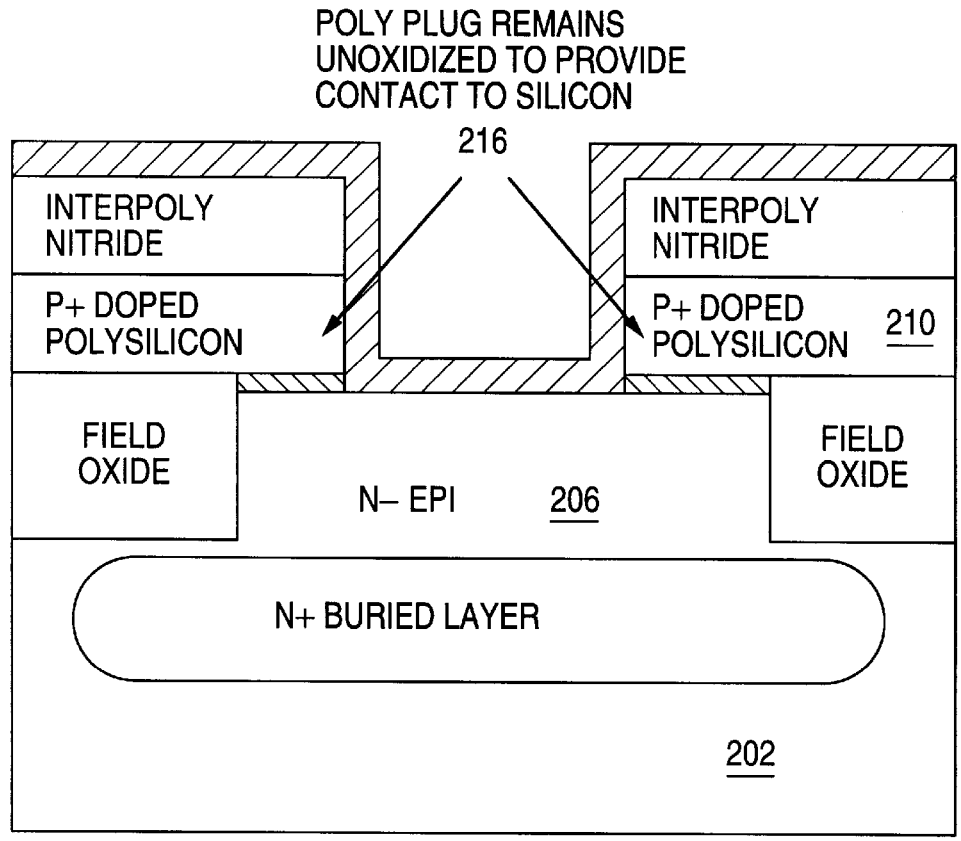

A chemical vapor deposition (CVD) process is then used to deposit a polysilicon "plug" in the region from which doped polysilicon layer 210 was removed (labelled "poly CVD plug fill" 214 in FIG. 2(D)). Note that the CVD process also causes polysilicon to fill into wet etch undercut regions 213 between epitaxial silicon layer 206 and polysilicon layer 210. The resulting structure is shown in FIG. 2(D). Polysilicon CVD material 214 will be used to form sidewall spacers for the device.

Next, polysilicon CVD material 214 is oxidized by using an appropriate furnace or anneal step. However, the polysilicon CVD material 214 between epitaxial silicon layer 206 and polysilicon layer 210 remains unoxidized (see element 216 in FIG. 2(E)), providing an electrical contact between those layers.

Figure 2F:
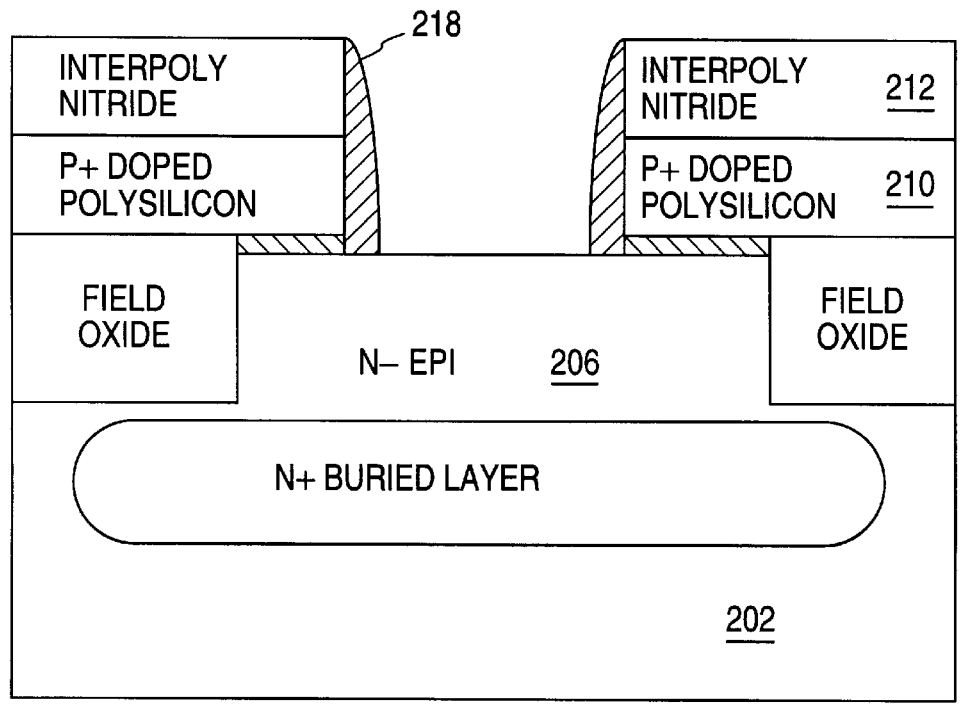

Sidewall spacers 218 are then formed from the oxidized polysilicon material using an etchback step which is more selective to oxide than to interpoly nitride layer 212. The resulting structure is shown in FIG. 2(F).

Figure 2G:
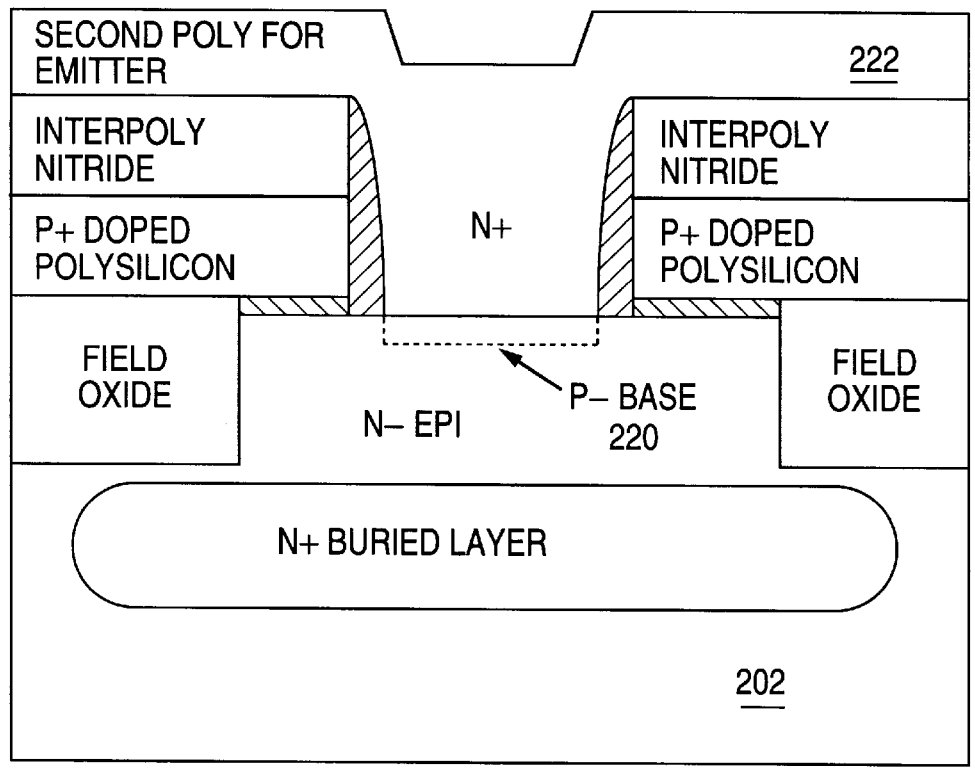

An appropriate dopant is then implanted into the base contact region to form the intrinsic base (shown as P– base 220 in the figure). A second layer of polysilicon 222 is then deposited over the surface of substrate 202. Polysilicon layer 222 is then implanted with an appropriate N+ type dopant (e.g., Arsenic or Phosphorus) as part of the process of forming the emitter for the device. The resulting structure is shown in FIG. 2(G).

Figure 2H:
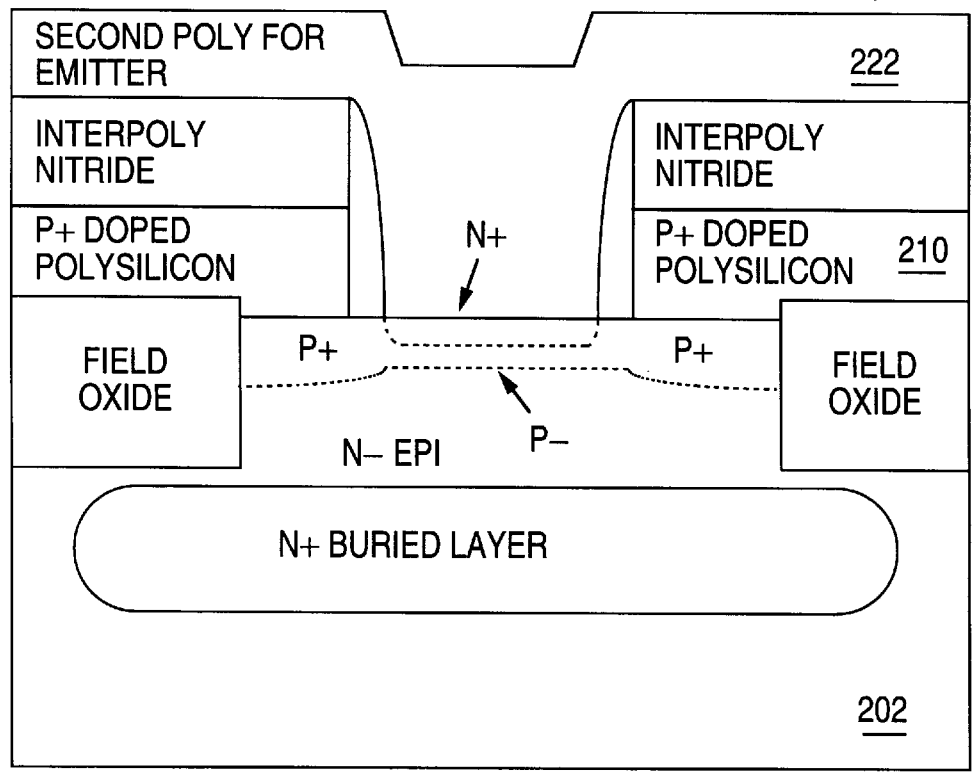

Next, a final anneal step is performed to drive in the implanted dopants and form the junctions for the device. As shown in FIG. 2(H), the anneal step causes the P+ type dopant in polysilicon layer 210 to be driven into unoxidized polysilicon material 216 and epitaxial silicon layer 206 in the areas surrounding the P− type intrinsic base region 220. The anneal step also causes the N+ type dopant implanted into polysilicon layer 222 to be driven into epitaxial layer 206.

Note that an alternative method of arranging for the P+ type dopant to be available for diffusion into epitaxial layer 206 is to dope the CVD polysilicon material in-situ. This has the advantage of introducing the device's intrinsic base dopant with a single step, thus avoiding an additional implant step.

The inventive method of forming a double polysilicon NPN transistor using a self-aligned process includes a sacrificial oxide layer 207 deposited between the epitaxial silicon 206 and the polysilicon base layer which acts as an etch stop. This permits over-etching of the polysilicon base contact layer 210 to prevent polysilicon stringers without etching of the underlying epitaxial silicon layer 206. The method uses deposited, but unoxidized, polysilicon 216 to form an electrical contact between the epitaxial silicon layer 206 and the polysilicon base layer 207. The method reduces the likelihood of polysilicon shorts and improves the yield of the process without impacting the operational characteristics of the device. In addition, by oxidizing portions of the deposited polysilicon 214 to form a sidewall spacer 218, the method provides superior step coverage when compared to conventional deposited oxide layers. The use of a sacrificial oxide layer 207 also permits better control of the characteristics of the emitter-extrinsic base junction compared to conventional methods. The inventive method can be used as part of both bipolar and BiCMOS process flows.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed.

I claim:

1. A method of fabricating an NPN transistor, comprising:

forming a N+ type buried layer in a silicon substrate;

forming an epitaxial silicon region on the silicon substrate;

forming field oxide isolation regions to define an epitaxial silicon active device region;

depositing a layer of oxide over the epitaxial silicon region;

forming a layer of P+ type polysilicon over the layer of oxide;

arranging a layer of nitride over the P+ type polysilicon layer;

patterning the nitride and P+ type polysilicon layers to define a location for an emitter for the NPN transistor;

etching the layer of oxide to the field oxide isolation regions to undercut the P+ type polysilicon layer;

depositing a layer of polysilicon over the surface of the substrate to fill the undercut of the P+ type polysilicon layer to the field oxide isolation regions;

performing an oxidation step on the deposited layer of polysilicon;

forming sidewall spacers for the emitter from the oxidized polysilicon;

implanting a P− type dopant into a base region of the NPN transistor;

forming a layer of N+ type polysilicon over the surface of the substrate; and performing an anneal step to form the junctions for the NPN transistor.

2. The method of claim 1, wherein the step of etching the layer of oxide to undercut the P+ type polysilicon layer further comprises:

performing a wet etch process to remove the layer of oxide from the surface of the epitaxial silicon region and from portions of a region between the layer of P+ type polysilicon and the epitaxial silicon region.

3. The method of claim 1, wherein the step of depositing a layer of polysilicon over the surface of the substrate further comprises:

depositing the layer of polysilicon by using a chemical vapor deposition (CVD) process.

4. The method of claim 1, wherein instead of the step of forming a layer of P+ type polysilicon over the layer of oxide, the method further comprises the steps of:

forming a layer of polysilicon over the layer of oxide; and doping the deposited layer of polysilicon with a P+ type dopant.

5. The method of claim 1, wherein said anneal step forms said junctions of said NPN transistor such that said junctions extend to the field oxide isolation regions.

6. The method of claim 1, wherein said oxide layer deposition step forms said oxide layer to have an upper surface coplanar with an upper surface of said field oxide isolation regions.

7. A method of forming a transistor, comprising:

defining an active device region in the substrate between field oxide isolation regions;

depositing a layer of oxide over the surface of the substrate;

depositing a first layer of polysilicon over the layer of oxide;

patterning the first layer of polysilicon to define an emitter region;

etching the layer of oxide to undercut the first layer of polysilicon to the field oxide isolation regions;

depositing a second layer of polysilicon over the surface of the substrate and in the undercut of the first polysilicon layer to the field oxide isolation regions;

performing an oxidation step to oxidize portions of the second layer of polysilicon;

forming sidewall spacers from the oxidized portions of the second layer of polysilicon;

forming a base region of the transistor;

depositing a third layer of polysilicon over the surface of the substrate; and performing an anneal step to form the junctions for the transistor.

8. The method of claim 7, wherein the step of etching the layer of oxide to undercut the first layer of polysilicon further comprises:

performing a wet etch process to remove the layer of oxide from the surface of the active device region and from portions of a region between the first layer of polysilicon and the active device region.

9. The method of claim 7, wherein the step of depositing a second layer of polysilicon over the surface of the substrate further comprises:

depositing the second layer of polysilicon by using a chemical vapor deposition (CVD) process.

10. The method of claim 7, wherein said anneal step forms said junctions of said NPN transistor such that said junctions extend to the field oxide isolation regions.

11. The method of claim 7, wherein said oxide layer deposition step forms said oxide layer to have an upper surface coplanar with an upper surface of said field oxide isolation regions.

12. A method of fabricating an NPN transistor, comprising:

forming a N+ type buried layer in a silicon substrate;

forming an epitaxial silicon region on the silicon substrate;

forming field oxide isolation regions to define an epitaxial silicon active device region;

depositing a layer of oxide over the epitaxial silicon region;

forming a layer of P+ type polysilicon over the layer of oxide;

arranging a layer of nitride over the P+ type polysilicon layer;

patterning the nitride and P+ type polysilicon layers to define a location for an emitter for the NPN transistor;

etching the layer of oxide to undercut the P+ type polysilicon layer;

depositing a layer of polysilicon over the surface of the substrate to fill the undercut of the P+ type polysilicon layer;

performing an oxidation step on the deposited layer of polysilicon;

forming sidewall spacers for the emitter from the oxidized polysilicon;

implanting a P– type dopant into a base region of the NPN transistor;

forming a layer of N+ type polysilicon over the surface of the substrate; and performing in-situ doping of said deposited layer of polysilicon to form the junctions for the NPN transistor.

13. The method of claim 12, wherein said oxide layer etching step etches said oxide layer to the field oxide isolation regions, and said polysilicon deposition step deposits said polysilicon to fill said undercut region to said field oxide isolation regions.

* * * * *